United States Patent
Kim et al.

(10) Patent No.: US 8,234,595 B2
(45) Date of Patent: Jul. 31, 2012

(54) METHOD OF DESIGNING A MASK LAYOUT

(75) Inventors: Young-Ile Kim, Gyeonggi-do (KR);
Moon-Hyun Yoo, Gyeonggi-do (KR);
Jong-Bae Lee, Gyeonggi-do (KR);
Jae-Pil Shin, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 439 days.

(21) Appl. No.: 12/498,470

(22) Filed: Jul. 7, 2009

(65) Prior Publication Data

US 2010/0005441 A1 Jan. 7, 2010

(30) Foreign Application Priority Data

Jul. 7, 2008 (KR) .................. 10-2008-0065397

(51) Int. Cl.
*G06F 17/50* (2006.01)
*H01L 21/20* (2006.01)
*H01L 21/388* (2006.01)

(52) U.S. Cl. .............. 716/50; 716/51; 716/54; 438/183; 438/391

(58) Field of Classification Search .............. 716/50–56; 438/183, 242–248, 259, 391, 626, 700
See application file for complete search history.

(56) References Cited

U.S. PATENT DOCUMENTS

| 5,866,466 | A | 2/1999 | Kim et al. |
| 6,656,814 | B2 | 12/2003 | Yoo et al. |
| 7,291,556 | B2 | 11/2007 | Choi et al. |
| 7,435,673 | B2 | 10/2008 | Lee et al. |
| 2003/0202412 | A1* | 10/2003 | Nii et al. ........................ 365/210 |
| 2006/0081968 | A1* | 4/2006 | Bai et al. ........................ 257/678 |
| 2007/0075359 | A1* | 4/2007 | Yoon et al. .................... 257/329 |

FOREIGN PATENT DOCUMENTS

| JP | 2003-179062 | 6/2003 |
| KR | 1020030092521 A | 12/2003 |
| KR | 1020070063617 A | 6/2007 |

* cited by examiner

*Primary Examiner* — Paul Dinh
(74) *Attorney, Agent, or Firm* — Myers Bigel Sibley & Sajovec, P.A.

(57) ABSTRACT

In a method of designing a mask layout, a wiring region for forming a metal wire is established, the wiring region having at least a standard width. Contact regions for forming contacts electrically connected to the metal wire are established in the wiring region. The contact regions adjacent to each other are grouped to divide the wiring region into a first region and a second region including the contact regions. First dummy regions are established in the first region, the first dummy regions corresponding to regions for forming first dummy patterns. Second dummy regions are established among the contact regions in the second region, the second dummy regions corresponding to regions for forming second dummy patterns.

9 Claims, 9 Drawing Sheets

METHOD OF DESIGNING A MASK LAYOUT

REFERENCE TO PRIORITY APPLICATION

This application claims priority to Korean Patent Application No. 2008-65397, filed Jul. 7, 2008, the contents of which are incorporated herein by reference.

FIELD OF THE INVENTION

Example embodiments relate to a method of designing a mask layout and a mask layout. More particularly, example embodiments relate to a method of designing a mask layout for forming a recess in an insulation layer, which is filled with metal material to form a metal wire, and a mask layout utilized to form a recess in an insulation layer.

BACKGROUND

In a rapidly developing information society, highly integrated semiconductor devices capable of achieving rapid data transfer rates are required so as to process data more quickly. In order to improve the data transfer rates, unit cells are integrated into a chip with a high degree of integration. For example, the design rules of metal wires have been rapidly decreasing in size. The metal wire is generally formed using copper (Cu). The metal wire including copper may has a relatively low resistivity. Further, when the metal wire is formed using copper, voids in the metal wire, which may occur due to an electromigration phenomenon, may be suppressed. However, patterning a copper layer including copper using an etching process may be complicated because chemical reactions of copper atoms with chemicals or gas are very complex. Further, the copper layer tends to be easily oxidized. Particularly, when the copper layer is exposed to air, the copper layer is easily oxidized to increase the electrical resistivity and the stress of the metal wire.

In order to solve the above-mentioned problems, a damascene process has been employed to form the metal wire including copper. FIG. 1 is a cross-sectional view illustrating a metal wire formed by a conventional damascene process.

Referring to FIG. 1, an insulation layer 10 is partially etched to form a trench 15 at a surface of the insulation layer 10. The trench 15 is filled with copper to form a copper layer (not shown) in the trench. The copper layer is then planarized by a chemical mechanical polishing (CMP) process until an upper face of the insulation layer 10 is exposed to form a metal wire 20 in the trench 15. However, while the copper layer is planarized by the CMP process, the copper layer may include a surface portion having a groove, which is called a dishing phenomenon, because the copper layer has a polishing rate greater than that of the insulation layer 10. The dishing phenomenon may occur severely when a width (W) of the metal wiring 10 becomes greater. Thus, the sheet resistance of the metal wire 20 including copper may increase such that a semiconductor device including the metal wire 20 may have deteriorated reliability.

SUMMARY

Example embodiments provide a method of designing a mask layout capable of suppressing a dishing phenomenon while polishing a metal layer filling a recess of an insulation layer.

Example embodiments provide a mask layout capable of suppressing a dishing phenomenon while polishing a metal layer filling a recess of an insulation layer.

In some example embodiments of a method of designing a mask layout, a wiring region for forming a metal wire is established. The wiring region has at least a standard width. Contact regions for forming contacts electrically connected to the metal wire are established in the wiring region. The contact regions adjacent to each other are grouped to divide the wiring region into a first region and a second region including the contact regions adjacent to each other. First dummy regions are established in the first region, the first dummy regions correspond to regions for forming first dummy patterns. Second dummy regions are established among the contact regions in the second region, the second dummy regions correspond to regions for forming second dummy patterns.

In an example embodiment, dividing the wiring region into the first and second regions may include extracting a region overlapping with or adjacent to the contact region from the wiring region.

In some example embodiments, the contact regions may be arranged in a matrix shape. Here, the second dummy regions may be arranged in a matrix shape.

In some example embodiments, the second dummy regions may have stripe shapes, respectively. Here, the second dummy regions may be arranged to cross each other.

In an example embodiment, each of the second dummy regions may have an L-shape.

In some example embodiments of a method of designing a mask layout, a wiring region for forming a metal wire is established. The wiring region has at least a first width. Preliminary dummy regions are established in the wiring regions. The preliminary regions correspond to regions for forming first dummy patterns. Contact regions are established in the wiring region. The contact regions correspond to regions for forming contacts. The preliminary dummy regions overlapping with or adjacent to the contact regions are excluded from the preliminary dummy regions to extract first dummy regions from preliminary dummy regions. Second dummy regions are established among the contact regions in the second region. The second dummy regions correspond to regions for forming second dummy patterns.

In some example embodiments, the contact regions may be arranged in a matrix shape. Here, the second dummy regions may be arranged in a matrix shape.

In some example embodiments, the second dummy regions may have stripe shapes, respectively. Here, the second dummy regions may be arranged to cross each other.

In an example embodiment, each of the second dummy regions may have an L-shape.

In some example embodiments, a mask layout includes a wiring region for forming a metal wire, the wiring region having at least a first width, contact regions formed in the wiring region, the contact regions corresponding to regions for forming contacts electrically connected to the metal wire, first dummy regions away from the contact regions, the first dummy regions corresponding to regions for forming first dummy patterns in the wiring region and second dummy regions among the contact regions, the second dummy regions corresponding to forming second dummy patterns.

In some example embodiments, the contact regions may be arranged in a matrix shape.

In some example embodiments, the second dummy regions may have stripe shapes, respectively.

According to some example embodiments, when a mask formed by a method of some example embodiments is employed to form an insulation layer structure including a recess and to form a metal wire filling the recess in a damascene process, a dishing phenomenon, which means that a metal layer is excessively polished to form a groove, may be suppressed. Particularly, the dishing phenomenon may be suppressed from occurring in the metal layer adjacent to contact regions.

DETAILED DESCRIPTION OF THE EMBODIMENTS

Figure 1:
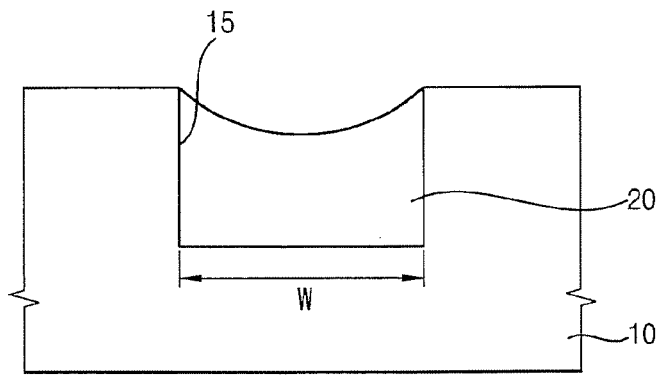
FIG. 1 is a cross-sectional view illustrating a metal wire formed by a conventional damascene process.

Various example embodiments will be described more fully hereinafter with reference to the accompanying drawings, in which some example embodiments are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region among the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

Figure 2:
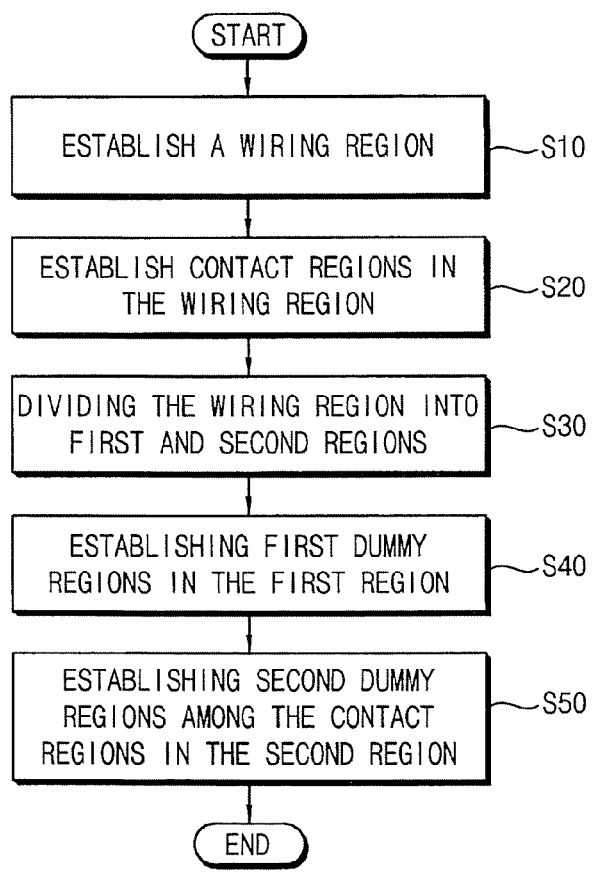
FIG. 2 is a flowchart illustrating a method of designing a mask layout in accordance with some example embodiments of the present invention.
Figure 3:
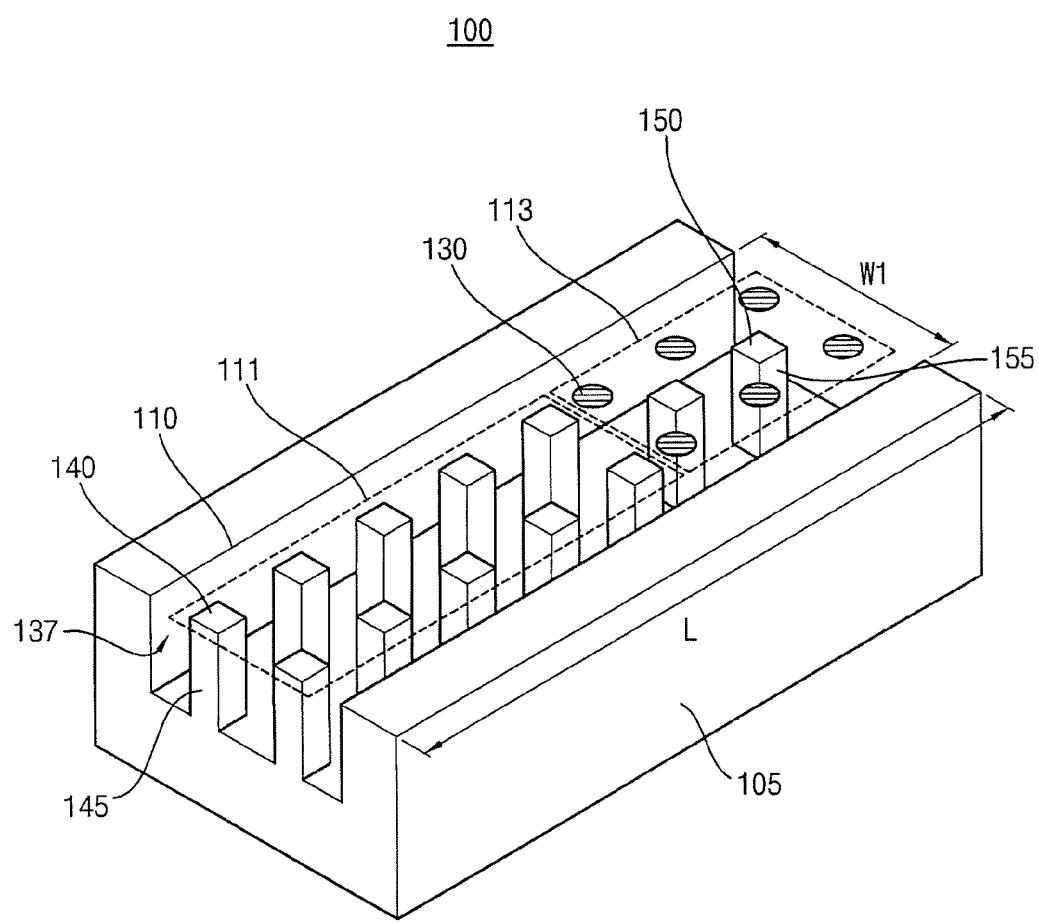
FIG. 3 is a perspective view illustrating an insulation layer structure manufactured using a mask formed by the method in FIG. 2.

FIG. 2 is a flowchart illustrating a method of designing a mask layout in accordance with some example embodiments of the present invention. FIG. 3 is a perspective view illustrating an insulation layer structure manufactured using a mask formed by the method in FIG. 2.

Referring to FIGS. 2 and 3, in a method of designing a mask layout in accordance with some example embodiments, a wiring region 110 is established (step S10). The wiring region 110 may correspond to a region where a metal wire (not shown) is formed. Further, the wiring region 110 may correspond to a region where a trench 137 is formed. The trench 137 is filled with a metal to form the metal wire in the wiring region 110. The metal may include copper (Cu), aluminum (Al), silver (Ag), gold (Au) or an alloy thereof.

The wiring region 110 may have a length (L) along a first direction in which the metal wire extends and a first width (W1) along a second direction perpendicular to the first direction.

The wiring region 110 may have the first width (W1) greater than a standard value that is set in advance. When a metal layer (not shown) filling up the trench 137 formed at a surface of an insulation layer 105 is polished, the metal layer may have a polishing selectivity relative to the insulation layer 105. For example, the metal layer may have a polishing rate greater than that of the insulation layer 105. Thus, while polishing the metal layer, the metal layer may be excessively removed to form a groove at a surface of the metal layer, which is called a dishing phenomenon. The dishing phenomenon may occur severely when a width of the metal wiring becomes greater. The standard value of the width of the wiring region 110 may be a minimum width of the wiring region 110, when the dishing phenomenon occurs such that the metal wire is determined to be a failure. For example, the standard value may be 10 μm. When the first width (W1) of the metal wire is below the standard value, first dummy regions 140 and second dummy regions 150, which will be described later, may be omitted.

A plurality of contact regions 130 is established (step S20) in the wiring region 110. The contact regions 130 may correspond to regions for forming a plurality of contacts (not shown) electrically connected to the metal wires.

The contacts formed in the contact regions 130 may electrically connect the metal wire to an upper line (not shown) formed over the metal line or with a lower line (not shown) formed below the metal line.

In an example embodiment, the contact regions 130 are arranged in a matrix shape of rows and columns.

After the contact regions 130 are established, the wiring region 110 is divided into a first region 111 and a second region 113 (step S30).

The second region 113 includes the contact regions 130. For example, the second region 113 may surround the contact regions 130 adjacent to each other. Thus, one region of the wiring region 110 including the contact regions 130 adjacent to each other is referred to as the second region 113. A remaining region of the wiring region 110 excluding the second region 113 is referred to as first region 111.

A plurality of first dummy regions 140 is established in the first region 111 (step S40). The first dummy regions 140 may correspond to regions where a plurality of first dummy patterns 145 is formed in the first region 111.

Each of the first dummy regions 140 may have a polygonal shape such as a triangle shape, a rectangular shape and a pentagonal shape. Alternatively, the first dummy regions 140 may have round shapes, respectively. Further, the first dummy regions 140 may be arranged spaced apart from each other. The first dummy regions 140 may be arranged in a matrix having a plurality of rows and columns.

The second dummy regions 150 are established in the second region 113 (step S50). The second dummy regions 150 may correspond to regions for forming second dummy patterns 155 located among the contact regions 130. For example, the second dummy regions 150 are non-overlapped with the contact regions 130 and are spaced apart from the contact regions 130.

When the second dummy regions 150 are not established in the second region 113 including the contact regions 130, the dishing phenomenon may occur in the second region 113 including the contact regions 130 while performing a chemical mechanical polishing (CMP) process for planarizing the metal layer filling the trench 137.

In some example embodiments, each of the second dummy regions 150 may have a polygonal shape such as a triangle shape, a rectangular shape and a pentagonal shape. Alternatively, the second dummy regions 150 may have round shapes, respectively. Further, the second dummy regions 150 may have stripe shapes, respectively. When each of the second dummy regions 150 may have the stripe shape, each of the second dummy regions 150 may extend parallel with each other. Alternatively, one of the second dummy regions 150 may extend in the first direction and another of the second dummy regions 150 may extend in the second direction to cross each other. Furthermore, the second dummy regions 150 may have L-shapes, respectively.

Each of the second dummy regions 150 may be adjusted to have various sizes, shapes, numbers and the second dummy regions 150 may be arranged in various manners.

Figure 4:
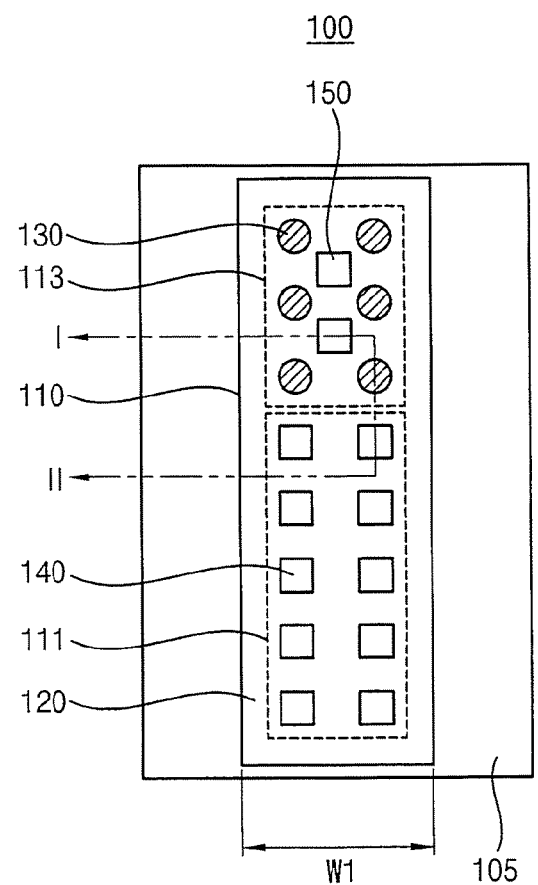
FIG. 4 is a plan view illustrating the insulation layer structure in FIG. 3.
Figure 5:
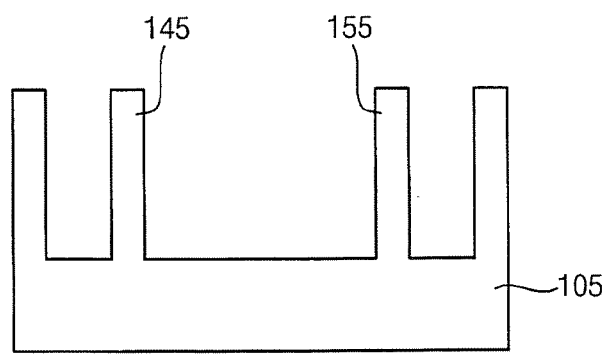
FIG. 5 is a cross-sectional view taken along a line I-II of FIG. 4.
Figure 6:
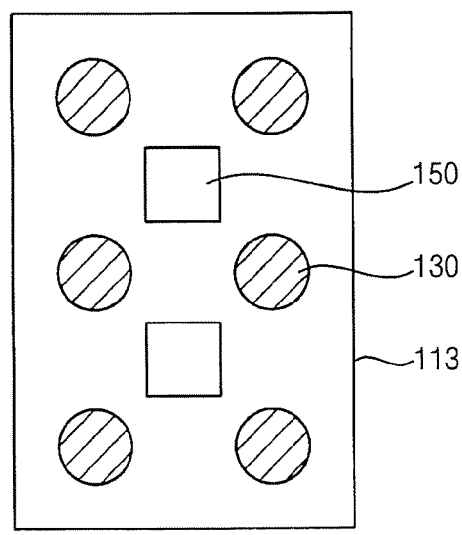
FIG. 6 is a plan view illustrating the insulation layer structure including the second dummy pattern in FIG. 3.

FIG. 4 is a plan view illustrating the insulation layer structure in FIG. 3. FIG. 5 is a cross-sectional view taken along a line I-II of FIG. 4. FIG. 6 is a plan view illustrating an insulation layer structure including the second dummy pattern in FIG. 3.

Referring to FIGS. 3 to 6, an insulation layer structure 100 is manufactured using a mask formed by a method of designing a mask layout in accordance with some example embodiments. The insulation layer structure 100 includes an insulation layer 105, a trench 137, first dummy patterns 145 and second dummy patterns 155.

The insulation layer 105 is formed using insulating material having electrically insulative characteristics. For example, the insulation layer 105 may include an oxide such as silicon oxide. Alternatively, the insulation layer 105 may include a nitride such as silicon nitride. The insulation layer 105 may electrically insulate external devices formed over the insulation layer structure 100, below the insulation layer structure 100 or in the insulation layer 105 from each other.

The trench 137 is formed at an upper surface of the insulation layer 105. The trench 137 is filled with metal material to form a metal layer (not shown). The metal layer is planarized to form a metal wire in the trench 137. For example, the upper surface portion of the insulation layer 105 is partially removed using the mask formed by the method in accordance with some example embodiments to form the trench 137 at an upper surface portion of the insulation layer 105.

The trench 137 may include a wiring region 110 and contact regions 130 in the wiring region 110. The wiring region 110 may correspond to a region where the trench 137 is formed. The wiring region 110 extends in the first direction and the wiring region 110 may have the first width (W1) along the second direction perpendicular to the first direction. The wiring region 110 may correspond to a region where a metal wire is formed.

The wiring region 110 is divided into a first region 111 and a second region 113 including the contact regions 130. That is, the second region 113 surrounds the contact regions 130 being adjacent to each other. A remaining region of the wiring region 110 excluding the second region 113 is defined as a first region 111. The first region 111 may have first dummy regions 140 where first dummy patterns 145 are formed.

The contact regions 130 are located in the wiring region 110. Each of the contact regions 130 may correspond to a region where a contact (not shown) is formed. The contacts are electrically connected to the metal wire formed in the wiring region 110. For example, the contact may electrically connect the metal wire to an upper line (not shown) formed over the metal line or with a lower line (not shown) formed below the metal line. The contact regions 130 may be arranged in a matrix having of rows and columns.

The first dummy patterns 145 are formed in the first dummy regions 140 of the first region 111, respectively. Each of the first dummy patterns 145 may protrude upwardly from the bottom of the trench 137. The first dummy patterns 145 are formed in the metal layer to decrease a polishing rate of the metal layer in a CMP process for planarizing the metal layer filling up the trench 137 because the first dummy patterns 145 may have a lower polishing rate than that of the metal layer.

The first dummy patterns 145 may be formed using the same material as the insulation layer 105. For example, when the insulation layer 105 includes silicon oxide, the first dummy patterns 145 include silicon oxide. Alternatively, when the insulation layer 105 includes silicon nitride, the first dummy patterns 145 include silicon nitride.

Each of the first dummy patterns 145 may have a shape having an upper face coincident to the first dummy region of the mask layout. For example, the first dummy patterns 145 have polygonal column shapes such as a triangle column shape, a rectangular column shape, a pentagonal column shape, etc. Alternatively, the first dummy patterns 145 may have circular cylinder shapes, respectively. Further, the first dummy patterns 145 may have various shapes, respectively.

Each of the second dummy patterns 155 is disposed in the second region 113. The second dummy patterns 155 are spaced apart from the contacts formed in the contact regions 130. That is, the second dummy patterns 155 are formed in the second dummy regions 260 of the second region 113. The second dummy patterns 155 upwardly protrude from the bottom of the trench 137. When dummy patterns being adjacent to the contact or being overlapped with the contact is removed from the insulation layer 105 in order to increase the reliability of an electrical connection among the contacts and an upper line/lower lines which are formed over/below the contacts, respectively, the dishing phenomenon may occur in the metal wire in the second region 113. On the other hand, when the second dummy patterns 155 are further formed in the second dummy regions 150 of the second region 133 and being spaced apart from the contacts, a polishing rate of the metal layer may decrease in a CMP process for planarizing the metal layer filling up the trench 137 because the second dummy patterns 155 may have a lower polishing rate than that of the metal layer.

Each of the second dummy patterns 155 may have a shape having an upper face overlapped with the second dummy region of the mask layout. For example, the second dummy patterns 155 have polygonal column shapes such as a triangle column shape, a rectangular column shape, a pentagonal column shape, etc. Alternatively, the second dummy patterns 155 may have circular cylinder shapes, respectively. Further, the second dummy patterns 155 may have various shapes, respectively. The second dummy patterns 155 may be arranged in a matrix of rows and columns.

Figure 7:
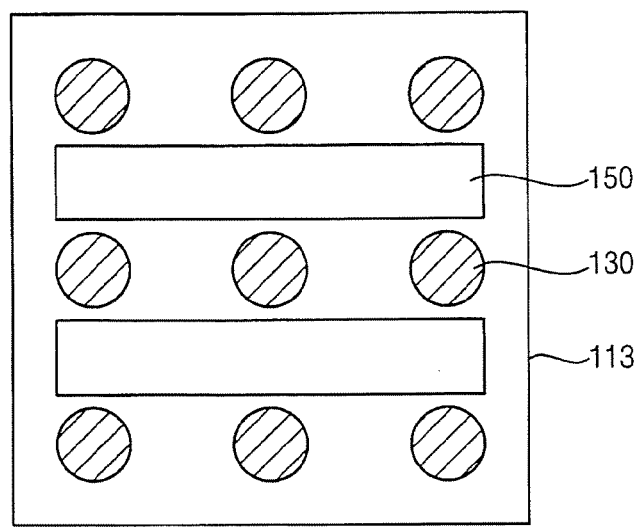
FIGS. 7 to 9 are plan views illustrating an insulation layer structure manufactured using a mask formed by the method in FIG. 2.
Figure 8:
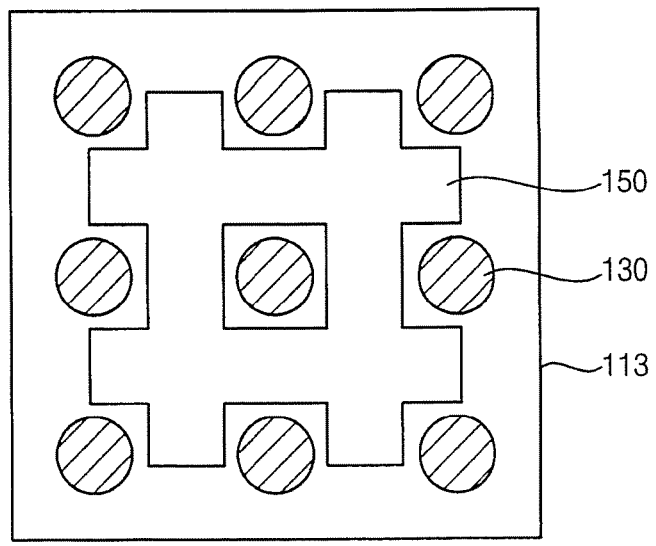
Figure 9:
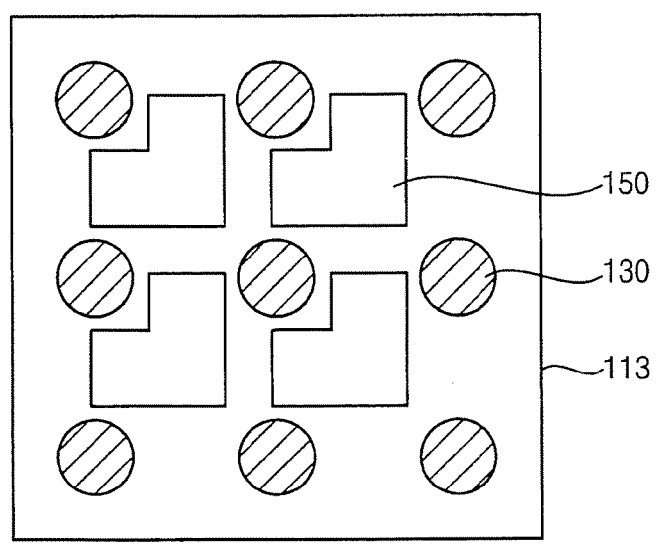

FIGS. 7 to 9 are plan views illustrating an insulation layer structure manufactured using a mask formed by the method in FIG. 2, respectively.

Referring to FIG. 7, an insulation layer structure 100 is manufactured using a mask formed by a method of designing a mask layout in accordance with some example embodiments. The insulation layer structure 100 includes an insulation layer 105, a trench 137, first dummy patterns 145 and second dummy patterns 155.

The insulation layer 105 is formed using insulating material having electrically insulative characteristics. For example, the insulation layer 105 may include an oxide such as silicon oxide or a nitride such as silicon nitride.

The trench 137 is formed at an upper surface of the insulation layer 105. The trench 137 is filled with metal material to form a metal layer (not shown). The metal layer is planarized to form a metal wire in the trench 137. The trench 137 may be formed at an upper surface portion of the insulation layer 105 by partially removing the upper surface portion of the insulation layer 105 using the mask formed by the method in accordance with some example embodiments.

The wiring region 110 may correspond to a region where the trench 137 is formed. The wiring region 110 is divided into a first region 111 and a second region 113 including the contact regions 130. That is, the second region 113 surrounds the contact regions 130 being adjacent to each other.

The contact regions 130 are positioned in the second region 113 of the wiring region 110. Each of the contact regions 130 may correspond to each of regions where contacts (not shown) are formed. Further, the contacts may be formed on the metal wire. The contacts may be electrically connected to the metal wire formed in the wiring region 110. The contact regions 130 may be arranged in a matrix having a plurality of rows and columns.

The first dummy patterns 145 are positioned in the first region 111, respectively. Each of the first dummy patterns 145 is formed in each of the first dummy regions 140.

The first dummy patterns 145 protrude from the bottom of the trench 137, respectively. The first dummy patterns 145 may decrease a polishing rate of the metal layer in a CMP process for planarizing the metal layer filling up the trench 137.

Each of the second dummy patterns 155 is disposed in the second region 113. The second dummy patterns 155 are spaced apart from the contacts formed in the contact regions 130. That is, the second dummy patterns 155 are formed in the second dummy regions 150 of the second region 113.

The second dummy patterns 155 upwardly protrude from the bottom of the trench 137. Each of the second dummy patterns 155 may have a stripe shape in a plan view. In one example embodiment, each of the second dummy patterns 155 may extend in a direction parallel to a first direction in which the trench 137 extends. In another example embodiment, each of the second dummy patterns 155 may extend in a direction perpendicular to the first direction.

The second dummy patterns 155 are adjacent to the contact and are not overlapped with the contact such that the second dummy patterns 155 are disposed in the metal layer which is formed by filling the trench 137 with metal material. Thus, the second dummy patterns 150 may decrease a polishing rate of the metal layer in a CMP process for planarizing the metal layer filling up the trench 137. Thus, the dishing phenomenon may be suppressed.

Referring to FIG. 8, an insulation layer structure 100 is manufactured using a mask formed by a method of designing a mask layout in accordance with some example embodiments. The insulation layer structure 100 includes an insulation layer 105, a trench 137, first dummy patterns 145 and second dummy patterns 155. The insulation layer structure 100 in FIG. 8 may have the same elements as those illustrated with respect to FIG. 7 except for the second dummy patterns 155. Thus, any detailed explanation on the same elements may be omitted in order to avoid redundancy.

Each of the second dummy patterns 155 is disposed in the second region 113 of the wiring region 110. The second dummy patterns 155 are not overlapped with the contact. Further, the second dummy patterns 155 are spaced apart from the contacts formed in the contact regions 130. That is, the second dummy patterns 155 are formed in the second dummy regions 150 of the second region 113.

When each of the second dummy regions 150 has a stripe shape, the second dummy patterns 155 may have stripe shapes, respectively, in a plan view. The second dummy patterns 155 having stripe shapes may be arranged to cross each other in a plan view. In other words, the second dummy patterns 155 include a first stripe portion extending in a first direction substantially parallel with a direction in which the trench 137 extends, and a second stripe portion extending in a second direction substantially perpendicular to the first direction.

The second dummy patterns 155 are formed in the second dummy regions 150 and among the contact regions 130 to decrease a polishing rate of a metal layer while the metal layer filling the trench 137 is planarized in a CMP process. Thus, a dishing phenomenon may be suppressed due to the second dummy patterns 155.

Referring to FIG. 9, an insulation layer structure 100 is manufactured using a mask formed by a method of designing a mask layout in accordance with some example embodiments. The insulation layer structure 100 includes an insulation layer 105, a trench 137, first dummy patterns 145 and second dummy patterns 155.

The insulation layer structure 100 in FIG. 9 may have the same elements as those illustrated with respect to FIG. 7 except for the second dummy patterns 155. Thus, any detailed explanation on the same elements may be omitted in order to avoid redundancy.

The second dummy patterns 155 are spaced apart from the contacts formed in the contact regions 130. That is, the second dummy patterns 155 are formed in the second dummy regions 150 of the second region 113. The second dummy patterns 155 protrude upwardly from the bottom of a trench 137. The second dummy patterns 155 are positioned to be apart from contacts 135 to decrease a polishing rate of a metal layer while the metal layer filling the trench 137 is planarized in a CMP process. Thus, a dishing phenomenon, which means that a central portion of the metal layer is excessively removed from the insulation layer 105 in the CMP process, may be suppressed.

In some example embodiments, each of the second dummy patterns 155 may have an L-shape in a plan view.

Figure 10:
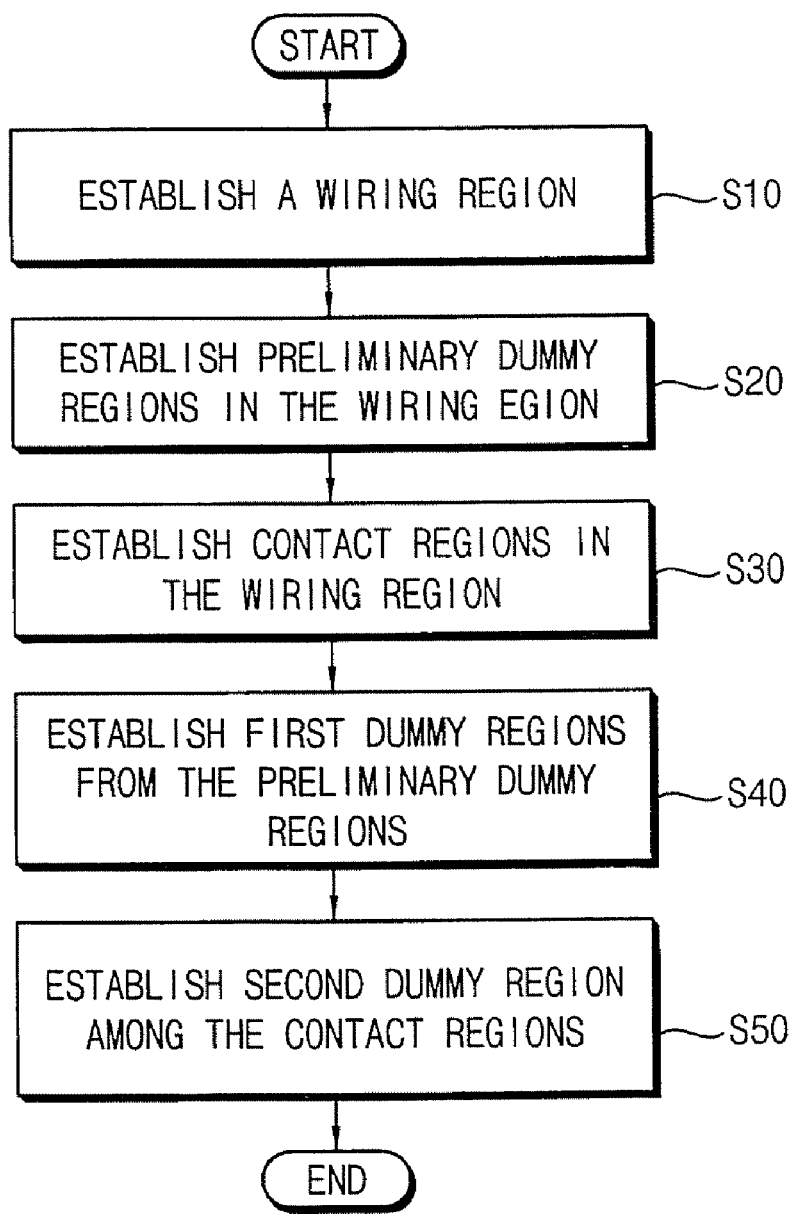
FIG. 10 is a flowchart illustrating a method of designing a mask layout in accordance with some example embodiments of the present invention.
Figure 11:
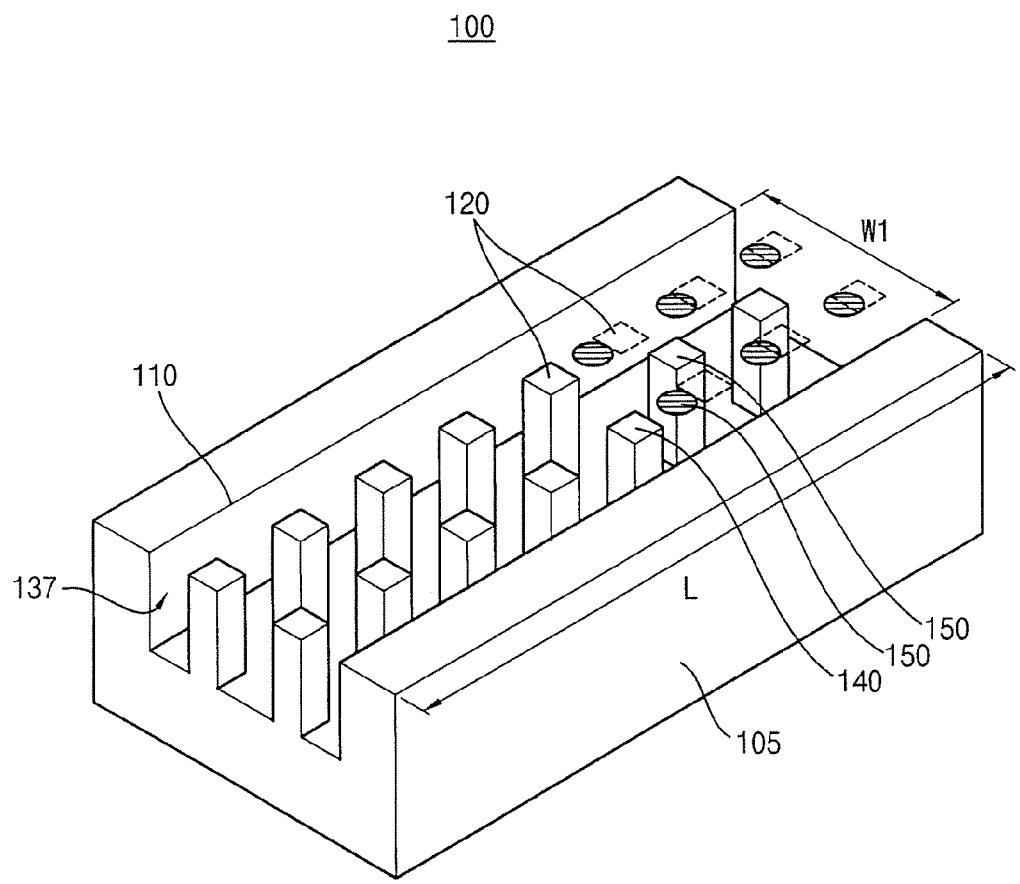
FIG. 11 is a perspective view illustrating an insulation layer structure manufactured using a mask formed by the method in FIG. 10.

FIG. 10 is a flowchart illustrating a method of designing a mask layout in accordance with some example embodiments of the present invention. FIG. 11 is a perspective view illustrating an insulation layer structure manufactured using a mask formed by the method in FIG. 10.

Referring to FIGS. 10 and 11, in a method of designing a mask layout in accordance with some example embodiments, a wiring region 110 is established (step S10). The wiring region 110 may correspond to a region where a metal wire is formed. Further, the wiring region 110 may correspond to a region where a trench 137 is formed on a surface of an insulation layer 105. The trench 137 is filled with metal material to form the metal wire in the wiring region 110. The wiring region 110 may have a length (L) along a first direction in which the metal wire extends and a first width (W1) along a second direction perpendicular to the first direction.

A plurality of preliminary dummy regions 120 is established (step S20). The preliminary dummy regions 120 may correspond to regions in which first dummy patterns 145 are formed.

Each of the preliminary dummy regions 120 may have a polygonal shape such as a triangle shape, a rectangular shape and a pentagonal shape. Alternatively, the preliminary dummy regions 120 may have round shapes, respectively. When the trench 137 is formed at a position of the surface of the insulation layer 105 and in the wiring region 110, and the first dummy patterns 145 are formed in the trench 137 at positions which correspond to some of the preliminary dummy regions 120, a plurality of first dummy patterns 145 is spaced apart from each other. Further, the first dummy patterns 145 may be arranged in a matrix of rows and columns in a plan view.

Contact regions 130 are established (step S30). The contact regions 130 correspond to regions for forming contacts 135 electrically connected to the metal wire formed in the wiring regions 110. The contacts 135 may electrically connect the metal wire to an upper line (not shown) formed over the metal line or with a lower line (not shown) formed below the metal line.

In an example embodiment, the contact regions 130 are arranged in a matrix shape. The contacts 135 formed in the contact regions 130 may also be arranged in the matrix shape having a plurality of rows and columns.

First dummy regions 140 are established (step S40). The first dummy regions 140 are regions which are defined by excluding some of the preliminary dummy regions 120 adjacent to the contact regions 130 from all of the preliminary dummy regions 120. That is, when the contact regions 130 are overlapped with one other or adjacent to each other, an electrical resistance among the metal wire and the contacts 135 may abnormally increase. Further, some of the preliminary dummy regions 120 being overlapped with the contact regions 130 or being adjacent to the contact regions 130 are erased to establish the first dummy regions 140. Thus, the abnormal increase of the electrical resistance among the metal wire and the contacts 135 may be suppressed.

Second dummy regions 150 are established (step S50). The second dummy regions 150 correspond to regions for forming second dummy patterns 155. The second dummy regions 150 may be positioned among the contact regions 130.

When the second dummy regions 150 are not established among the contact regions 130, the second dummy patterns 155 may not be formed adjacent to the contact. Thus, a dishing phenomenon may occur in the metal layer filling up the trench 137 when the metal layer is planarized in a CMP process. However, when the second dummy patterns 155 are formed to be apart form the contacts 135, the dishing phenomenon may be suppressed in the CMP process. Each of the second dummy patterns 155 may have various sizes, shapes and the second dummy patterns 155 are arranged in various manners.

Figure 12:
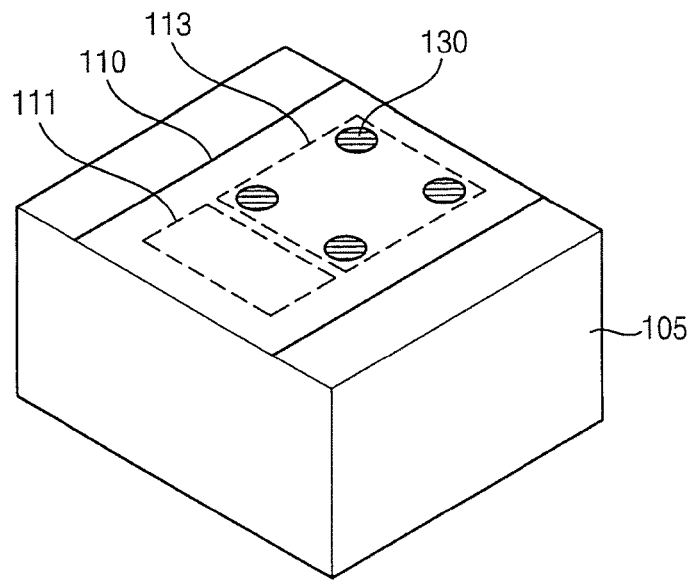
FIGS. 12 to 14 are perspective views illustrating a method of forming a metal wire on an insulation layer structure using a mask formed by the method in FIG. 2.
Figure 13:
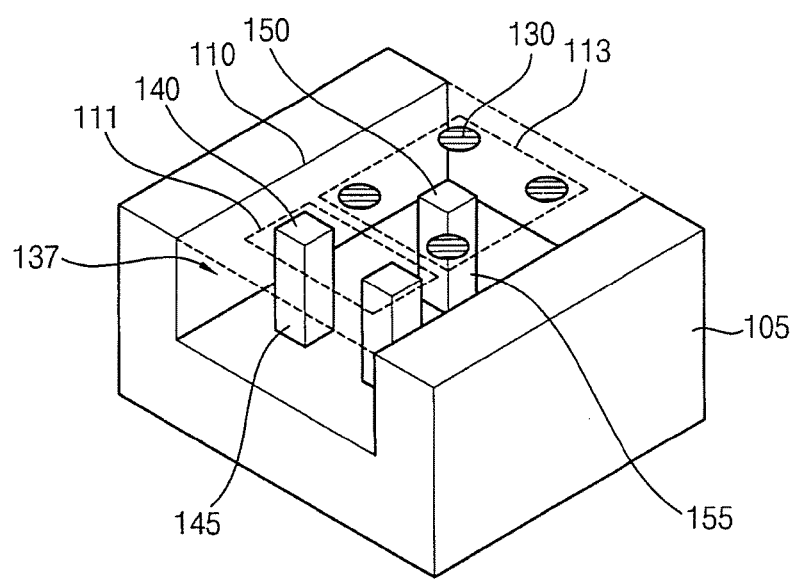
Figure 14:
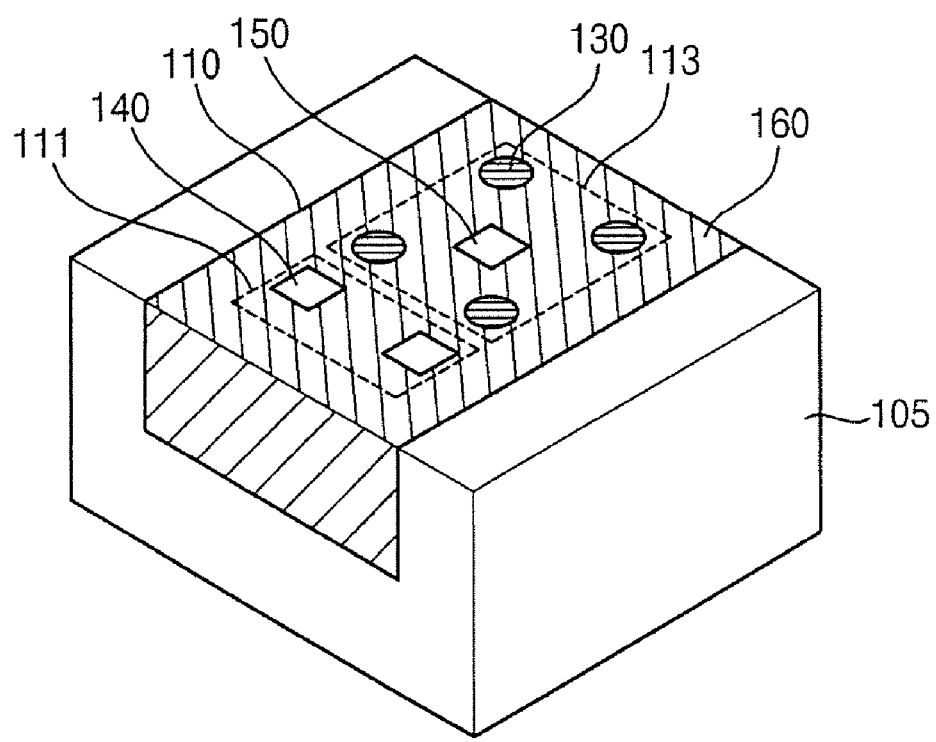

FIGS. 12 to 14 are perspective views illustrating a method of forming a metal wire on an insulation layer using a mask formed by the method of designing the mask layout illustrate with reference to FIG. 2.

Referring to FIG. 12, an insulation layer 105 is provided. The insulation layer 105 may be electrical insulative. A wiring region 110 is established on the insulation layer 105. The wring region 110 may correspond to a region for forming a trench 137 on a surface of the insulation layer 105 and a region for forming a metal wire by filling the trench 137 with metal material. That is, the wring region 110 may correspond to a region for forming the trench 137 as well as a region for forming the metal wire.

The wiring region 110 may be divided into a first region 111 and a second region 113 surrounding contact regions 130 being adjacent to each other. The second region 113 may include the contact regions 130 being adjacent to each other. The first region 111 may correspond to a region excluding the second region 113 from the wiring region 110.

The contact regions 130 are positioned in the second region 113 of the wiring region 110. The contact regions 130 may correspond to regions for forming contacts (not shown) on the metal wire. The contact regions 130 may be arranged in a matrix shape of rows and columns.

The insulation layer 105 is formed using insulating material having electrically insulative characteristics. For example, the insulation layer 105 may include an oxide or a nitride such as silicon oxide, silicon nitride or silicon oxynitride.

Referring to FIG. 13, the insulation layer 105 is partially etched using a mask to form an insulation layer structure 100 including a trench 137, first dummy patterns 145 and second dummy pattern. The trench 137 may be formed by removing a surface portion of the wring portion 110 from the insulation layer 105. The first dummy patterns 145 may be formed at the first dummy regions 140 in the first region 111 of the wiring region 110. The second dummy patterns 155 may be formed in the second dummy regions 150. The second dummy patterns 155 may be formed among the contacts 135 formed in the contact regions 130.

For example, a photoresist layer (not shown) is formed on the insulation layer 105. While the mask formed by the method of designing the mask layout in FIGS. 2-6 is positioned over the photoresist layer, the photoresist layer is exposed to light. Then, the photoresist layer is developed to form a photoresist layer pattern (not shown) on the insulation layer 105. The photoresist layer pattern is used as an etch mask in the etch process to form the insulation layer structure 100 including the trench 137, first dummy patterns 145 and second dummy patterns 155. The first and second dummy patterns 145 and 155 may be formed simultaneously.

The mask may be formed by the method of designing a mask layout with reference with FIGS. 2-6. Any detailed explanation on the mask will be omitted.

The trench 137 is formed at the wiring region 110. The trench is filled with metal material to form the metal wire.

The first dummy patterns 145 are formed in the first region 111 of the wiring region 110. The first dummy patterns 145 may upwardly protrude from the bottom of the trench 137. The first dummy patterns may decrease a polishing rate of a metal layer which fills up the trench 137 while the metal layer is planarized in a CMP process.

The first dummy patterns 145 may be formed using the same material as that of the insulation layer 105. For example, when the insulation layer 105 includes silicon oxide, the first dummy patterns 105 include silicon oxide.

Sizes and shapes of the first dummy patterns 105 and a pitch among the first dummy patterns 105 may vary considering the electrical conductivity of the metal wire and positions and sizes of the contacts 135.

The second dummy patterns 155 are formed in the second dummy regions 150. The second dummy patterns 155 are positioned apart from the contact formed in the contact region 130 to suppress the contacts 135 from having a deteriorated electrical conductivity due to the second dummy patterns 155.

Further, the second dummy patterns 155 protrude upwardly from the bottom of the trench 137. Thus, the second dummy patterns 155 may decrease a polishing rate of a metal layer which fills up the trench 137 while the metal layer is planarized in a CMP process.

The second dummy patterns 155 have polygonal column shapes such as a triangle column shape, a rectangular column shape, a pentagonal column shape, etc. Alternatively, the second dummy patterns 155 may have circular cylinder shapes, respectively. Further, the second dummy patterns may be arranged in a matrix having a plurality of rows and columns in a plan view.

In some example embodiments, the second dummy patterns 155 may have stripe shape, respectively, in a plan view. The second dummy patterns 155 are arranged to cross each other. Further, the second dummy patterns 155 have L-shapes, in a plan view.

Referring to FIG. 14, the trench 137 is filled with a metal material to form a metal layer (not shown) filling the trench 137. The metal material may include copper (Cu), aluminum (Al), silver (Ag), gold (Au) or an alloy thereof. The metal layer is formed to fill the trench 137 and to cover an upper face of the insulation layer 105 adjacent to the trench 137. The metal layer may be over-planarized until the upper face of the insulation layer 105 is exposed to form a metal wire 160 in the trench 137. The metal layer may be planarized by a CMP process. Even though the metal layer has a polishing rate higher than that of the insulation layer 105, the polishing rate of the metal layer may decrease because of the first and second dummy patterns 145 and 155 formed in the trench 137. Thus, a dishing phenomenon, which means that a central portion of the metal layer is excessively polished to form a groove in the central portion, may be suppressed. As a result, the sheet resistance of the metal wire may decrease to improve the operating speed of a semiconductor device including the metal wire.

According to some example embodiments, when a mask formed by a method of designing a mask layout is utilized to form a metal wire on an insulation layer structure by a damascene process, dummy patterns positioned among contact regions may be formed to suppress a dishing phenomenon from occurring in polishing a metal layer.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of designing a mask layout comprising:
   establishing a wiring region for forming a metal wire in a trench in an insulation layer;
   establishing contact regions for forming contacts electrically connected to the metal wire in the wiring region;

grouping the contact regions adjacent to each other to divide the wiring region into a first region and a second region including the contact regions adjacent to each other;

establishing first dummy regions in the first region, the first dummy regions corresponding to regions for forming first dummy patterns in the trench in the insulation layer, the first dummy patterns having a lower polishing rate than a metal for forming the metal wire; and establishing second dummy regions among the contact regions in the second region, the second dummy regions corresponding to regions for forming second dummy patterns.

2. The method of claim 1, wherein dividing the wiring region into the first and second regions includes establishing the second region by extracting a region overlapping with or adjacent to the contact region from the wiring region.

3. The method of claim 1, wherein the contact regions are arranged in a matrix shape.

4. The method of claim 3, wherein the second dummy regions are arranged in a matrix shape.

5. The method of claim 1, wherein the second dummy regions have stripe shapes, respectively.

6. The method of claim 5, wherein the second dummy regions are arranged to cross each other.

7. The method of claim 1, wherein each of the second dummy regions has an L-shape.

8. The method of claim 1, wherein the wiring region has at least a width of about 10 micrometers.

9. The method of claim 1, wherein the second dummy regions are spaced apart from the contact regions in the trench in the insulation layer.

* * * * *